(12) United States Patent
Fefer et al.

(10) Patent No.: US 7,928,753 B2
(45) Date of Patent: Apr. 19, 2011

(54) DEVICE AND METHOD FOR EVALUATING ELECTROSTATIC DISCHARGE PROTECTION CAPABILITIES

(75) Inventors: Yehim-Haim Fefer, Petah-Tikva (IL); Sergey Sofer, Reshon Letzion (IL)

(73) Assignee: Freescale Semiconductor, Inc., Austin, TX (US)

( * ) Notice: Subject to any disclaimer, the term of this patent is extended or adjusted under 35 U.S.C. 154(b) by 355 days.

(21) Appl. No.: 12/160,008

(22) PCT Filed: Jan. 4, 2006

(86) PCT No.: PCT/IB2006/050029
§ 371 (c)(1),
(2), (4) Date: Jul. 3, 2008

(87) PCT Pub. No.: WO2007/077495
PCT Pub. Date: Jul. 12, 2007

(65) Prior Publication Data
US 2010/0225346 A1    Sep. 9, 2010

(51) Int. Cl.
*G01R 31/26* (2006.01)
(52) U.S. Cl. .............................. 324/762.01; 324/762.02
(58) Field of Classification Search ........................ None
See application file for complete search history.

(56) References Cited

U.S. PATENT DOCUMENTS

| | | | |
|---|---|---|---|
| 5,745,324 A * | 4/1998 | Forsland et al. | ................. 361/56 |
| 5,978,197 A | 11/1999 | Chan | |
| 6,429,674 B1 | 8/2002 | Barth et al. | |
| 6,469,536 B1 | 10/2002 | Kessler et al. | |
| 6,586,266 B1 | 7/2003 | Lin | |
| 6,906,386 B2 | 6/2005 | Williams et al. | |
| 6,933,741 B2 * | 8/2005 | Duvvury et al. | ............... 324/765 |
| 2002/0145432 A1 | 10/2002 | Allard, Jr. et al. | |

FOREIGN PATENT DOCUMENTS

| EP | 0867727 B1 | 6/2004 |
|---|---|---|
| WO | 9508124 A1 | 3/1995 |

OTHER PUBLICATIONS

Ker et al; "ESD test Methods on Integrated Circuits: An Overview"; 8th IEEE International Conference on Electronics and Systems, 2001, vol. 2, pp. 1011-1014.
Stockinger et al; "Boosted and Distributed Rail Clamp Networks for ESD Protection in Advanced CMOS Technologies"; EOS/ESD Symposium Proceedings, 2003.

* cited by examiner

*Primary Examiner* — Vinh P Nguyen

(57) ABSTRACT

A device and a method for evaluating ESD protection capabilities of an integrated circuit, the method includes: connecting multiple test probe to multiple integrated circuit testing points. The method is characterized by repeating the stages of: (i) charging a discharge capacitor to an ESD protection circuit triggering voltage level; (ii) connecting the discharge capacitor to the integrated circuit during a testing period such as to cause the discharge capacitor to interact with the integrated circuit; (iii) measuring at least one signal of the integrated circuit, during at least a portion of the testing period; and (iv) determining at least one ESD protection characteristic of the integrated circuit in response to the at least one signal.

20 Claims, 7 Drawing Sheets

DEVICE AND METHOD FOR EVALUATING ELECTROSTATIC DISCHARGE PROTECTION CAPABILITIES

FIELD OF THE INVENTION

The present invention relates to devices and methods for evaluating electrostatic discharge (ESD) protection capabilities.

BACKGROUND OF THE INVENTION

Electrostatic discharge (ESD) can damage integrated circuits. ESD can occur when a human touches an integrated circuit, when the integrated circuit contacts a machine or when the integrated circuit contacts a package in which the integrated circuit is packaged.

ESD can dramatically reduce the yield of integrated circuits. In order to reduce the affect of ESD events various ESD protections circuits were developed. The ESD protection circuits include snap-back ESD protection circuits, non snap-back ESD protection circuits, and the like. Pad based ESD protection circuits as well as rail-based ESD protection circuits were also developed. Different ESD protection circuits can have different response patterns.

Various ESD protection circuits and methods, as well as some prior art ESD testing methods are illustrated in the following articles, patents and patent applications, all being incorporated herein by reference: "ESD test methods on integrated circuits: an overview", M. D. Ker, J. J. Peng and H. C. Jiang, ICECS 2001, 8$^{th}$ IEEE International conference on Electronics and Systems, pg. 1011-1014, vol. 2; "Boosted and distributed rail clamp networks for ESD protection in advanced CMOS technologies", M. Stockinger, J. Miller, M. Khazhinsky, C. Torres, J. Weldon, B. Preble, M. Akers, EOS/ESD Symposium proceedings 2003; U.S. Pat. No. 6,469,536 of Kessler at al.; U.S. Pat. No. 5,978,197 of Chan; U.S. Pat. No. 6,586,266 of Lin; U.S. patent application publication serial number 2002/0145432 of Allard. Jr. et al.; U.S. Pat. No. 6,906,386 of Williams et al. and PCT patent application publication serial number WO95/08124.

Many ESD testing methods include applying a high voltage signal to an integrated circuit. The high voltage can damage integrated circuit components and cause the defective integrated circuit components to emit infrared radiation. The infrared radiation can be detected by an infrared microscope. The appliance of high-voltage does not enable to accurately measure signals from the integrated circuit while the high voltage signals is applied to it.

Various prior art ESD testing methods include causing an electrical arc discharge between the integrated circuit and the testing device. This arc cannot be accurately repeated, thus a large number of tests can be required.

There is a need to provide a device and method for efficiently evaluating electrostatic discharge (ESD) protection capabilities of an integrated circuit.

SUMMARY OF THE PRESENT INVENTION

A device and a method for evaluating electrostatic discharge (ESD) protection capabilities of an integrated circuit, as described in the accompanying claims.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

Figure 1:
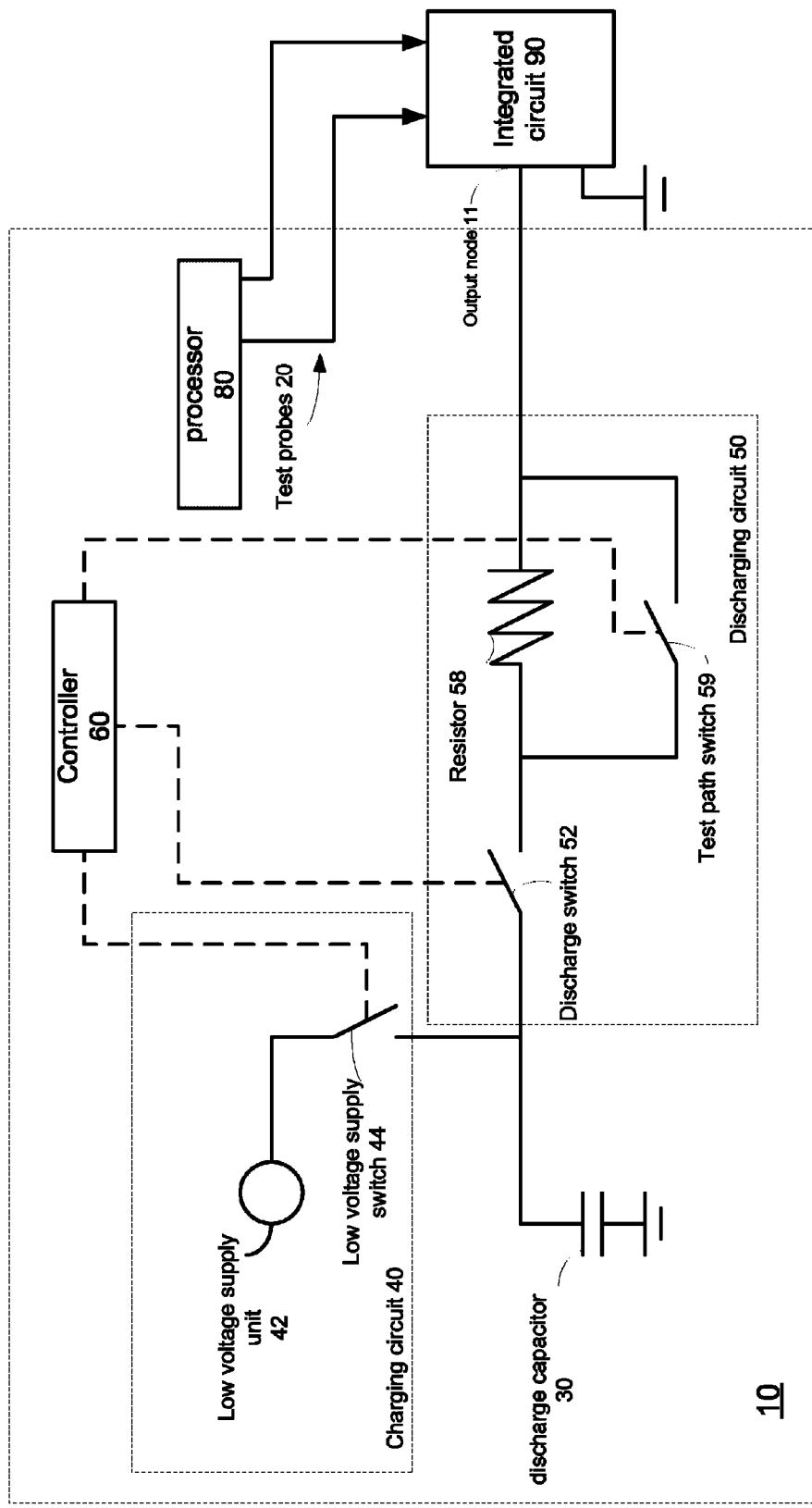
FIG. 1 illustrates a device, according to an embodiment of the invention.

The following figures illustrate exemplary embodiments of the invention. They are not intended to limit the scope of the invention but rather assist in understanding some of the embodiments of the invention. It is further noted that all the figures are out of scale.

It is assumed that an integrated circuit is tested. It is noted that other devices (also referred to devices under test) can be tested by applying the methods or the devices described below.

According to an embodiment of the invention a method and device for testing ESD protection capabilities of an integrated circuit are provided. The integrated circuit is provided with an ESD protection circuit triggering signal. This signal can be a voltage signal, a current, and the like. The signal can change during the test period.

The ESD protection circuit triggering signal is designed such as to activate (trigger) the ESD protection of the integrated circuit. The ESD protection circuit triggering signal can be characterized by a pattern (change of voltage an/or current over time), by its voltage level, power level, energy level or current level that should trigger the ESD protection of the integrated circuit.

For example, an ESD protection circuit can be triggered when it receives an input signal that is characterized by (i) voltage levels that exceed a predefined minimal voltage threshold and, (ii) a voltage change rate that is above a minimal voltage rate minimal threshold.

When a device that includes the mentioned above ESD protection circuit is tested then the ESD protection circuit triggering signal should be characterized by voltage levels that are above the minimal voltage threshold and by voltage change rates that exceed the minimal voltage threshold.

According to an embodiment of the invention this voltage changes relatively rapidly, and especially more rapidly than the transient of the voltage supplied by a voltage supply during the power up or the like. This rapid change should trigger the ESD protection circuit. According to an embodiment of the invention the ESD protection circuit triggering signal does not exceed a maximal threshold (also referred to as ESD protection circuit triggering maximal voltage level) that is relatively low, and especially lower than 200 v that is commonly used in machine model ESD immunity tests.

The device includes a discharge capacitor whose voltage oscillates when it discharges through the integrated circuit. Conveniently, the discharge capacitor is a part of an oscillating circuit that also includes conductors and switches that are connected between the discharge capacitor and the integrated circuit, as well as a portion of the integrated circuit.

According to an embodiment of the invention the ESD protection circuit triggering maximal voltage level does not exceed a maximal threshold that is relatively low and enables the integrated circuit to quickly recover from the provision of the ESD protection circuit triggering signal, thus enabling rapid repetitions of the test.

According to an embodiment of the invention, the maximal threshold is relatively low, thus enabling to monitor the voltage and/or currents of one or more testing points within the integrated circuit, during the testing period.

Conveniently, the provision of an ESD protection circuit triggering signal can be accurately repeated during different testing periods. Thus, the results gained from different tests can be compared to each other with a high degree of certainty. This facilitates to execute few tests in order to gain sufficient testing results. Alternatively or additionally, a relatively low level ESD protection circuit triggering signal enables to perform many tests in a relatively short period and to gain statistics that makes it different from the standard ESD testing equipment like Paragon that provides destructive test.

According to an embodiment of the invention the discharge capacitor can interact with the integrated circuit while being discharged, thus enables to emulate ESD events than transmission line pulse (TLP) methods. TLP does not enable to emulate the real ESD event pattern (voltage oscillations that occur during an ESD event).

Conveniently, a method for evaluating ESD protection capabilities of an integrated circuit is provided. The method includes: (i) connecting multiple test probes to multiple integrated circuit testing points; (ii) charging a discharge capacitor to an ESD protection circuit triggering voltage level, (iii) connecting the discharge capacitor to the integrated circuit during a testing period such as to cause the discharge capacitor to interact with the integrated circuit; (iv) measuring the voltage/current of at least one testing point of the integrated circuit under test, during at least a portion of the testing period; and (v) determining at least one ESD protection characteristic of the integrated circuit in response to the at least one signal. Conveniently, the discharge capacitor is charged to an ESD protection circuit triggering maximal voltage level, or to a voltage level that guarantees that an ESD protection circuit triggering maximal voltage level reaches the integrated circuit.

Conveniently, a device for evaluating ESD protection capabilities of an integrated circuit is provided. The device includes: (i) multiple test probes adapted to be connected to multiple integrated circuit testing points, (ii) a discharge capacitor, (iii) a charging circuit adapted to charge the capacitor to an ESD protection circuit triggering voltage level, (iv) a discharging circuit, adapted to selectively connect the discharge capacitor, during a testing period, to the integrated circuit such that the discharge capacitor interacts with the integrated circuit while being discharged, and (v) a processor that is adapted to process multiple signals received from the multiple test probes and to assist in determining at least one ESD protection characteristic of the integrated circuit.

The ESD protection characteristics can include the clamping efficiency of the ESD protection circuit, the amplitude of voltage (or current) that is outputted from the ESD protection circuit, the pattern of the output voltage (or current) of the ESD protection circuit, and the like.

FIG. 1 illustrates device 10 according to an embodiment of the invention. Device 10 includes multiple test probes 20, charging circuit 40, discharging circuit 50, and processor 80.

The multiple test probes 20 are adapted to be connected to multiple integrated circuit testing points. Test probes 20 can include two test probes (such as test probes 21 and 22) but may include one or more test probes.

Test probes 20 receive signals from testing points of the integrated circuit. These signals that are received outside testing periods can be ignored, but this is not necessarily so.

Test probes 20 are conveniently connected to processor 80 that can process the received signals. Processor 80 can determine one or more ESD protection characteristics of a certain integrated circuit.

It is noted that multiple independents testing points can be connected to test probes and the multiple tests of different testing points can be executed in parallel to each other.

It is noted that processor 80 can be a standard measurement device such as but not limited to an oscilloscope, but this is not necessarily so. It is further noted that a portion of the analysis process can be done by a user but this is not necessarily so.

Charging circuit 40 is adapted to charge the discharge capacitor 30 to an ESD protection circuit triggering voltage level. The charging circuit 40 conveniently includes a low voltage supply unit 42 and a low voltage supply switch 44. The low voltage supply unit 42 is adapted to provide an output voltage of about an ESD protection circuit triggering voltage level.

The voltage supply unit 42 is connected, via the voltage supply switch 44, to the discharge capacitor 30. The charging circuit 40 is adapted to charge the discharge capacitor 30 to the ESD protection circuit triggering voltage level during a charging period that precedes a testing period. Conveniently, during the charging period the voltage supply switch 44 is closed and during other periods (such as testing periods) the voltage supply switch 44 is open.

Discharging circuit 50 is adapted to selectively connect the discharge capacitor 30, during a testing period, to the integrated circuit 90 such that the discharge capacitor 30 interacts with the integrated circuit 90 while being discharged. Conveniently, the discharging circuit 50 includes a discharge switch 52 that is connected between the discharge capacitor 30 and the integrated circuit 90. Conveniently, during the testing period the discharge switch 52 is closed and during other periods (such as charging periods) the discharge switch 52 is open.

According to an embodiment of the invention the discharging circuit 50 can include multiple test paths. The test paths can correspond to different ESD modules that are being tested. For example, a first test path can include a resistor 58, while a second test path includes a test path switch 59. The first rest path can be used to test human body model-like ESD events (HBM) while the second test path can be used to test machine model-like (MM) ESD events. The test path switch 59 is connected in parallel to resistor 58. If the test path switch 59 is closed resistor 58 is bypassed and the second test path is selected. If the test path switch 50 is open then the first test path is selected.

According to an embodiment of the invention the discharging circuit 50 and the charging circuit 40 are controlled by a controller 60. The controller 60 can determine the state of switches 44, 52 and 59, activate or deactivate the low voltage supply unit 42 and the like.

The controller 60 can be integrated with the processor 80 (for example a common processing unit can implement both functions), but this is not necessarily so.

Conveniently a testing period is longer than three oscillation cycles of an oscillatory circuit 12 that includes the discharge capacitor 30 and at least a portion 92 of the integrated circuit 90. The portion 92 is connected to the discharge capacitor 30 and oscillates with the discharge capacitor. The components that oscillate with the discharge capacitor 30 depend upon the test path defined between the discharge capacitor and the integrated circuit as well as the internal structure of the integrated circuit. Usually, portion 92 includes components that belong to the ESD protection circuit of integrated circuit 90. It is noted that the I/O pads of the integrated circuit 90 that receive the discharged signal of discharge capacitor 30 also belong to portion 92.

According to an embodiment of the invention the device 10 is adapted to define the EDS protection circuit triggering voltage level. This level can be determined in view of the voltage level that is expected to trigger the ESD protection mechanism of integrated circuit 90.

Conveniently, this level is also determined such as to enable relatively short thermal relaxation periods of the integrated circuits, thus facilitating a performance of many repetitions of the test during a relatively limited period. It is also noted that by using a relatively low ESD protection circuit triggering voltage level the charging process and the discharging process of the discharge capacitor can be relatively short.

It is noted that the ESD protection circuit triggering signal can be limited to a maximal value (also referred to as ESD protection circuit triggering voltage level). The maximal value can be equal to, above or below the level of the supply voltage provided to the integrated circuit. It is noted that the ESD protection circuit of the integrated circuit can monitor the change rate of signals that are provided to the integrated circuit and/or monitor their level in order to determine when to activate the ESD protection scheme.

For example, if an integrated circuit operates at about five volts then a signal that exceeds ten volts should trigger its ESD protection circuits. Yet for another example, a signal that is less then five volts but rises very rapidly can also trigger the ESD protection circuit.

Conveniently, the ESD protection circuit triggering voltage level is defined, by device 10, in response, to a thermal relaxation period of the integrated circuit, and to a predefined high repetition rate.

The inventors used a level of about forty volts although other values can be used. Conveniently the ESD protection circuit triggering maximal voltage level is lower than two hundred volts. Conveniently the ESD protection circuit triggering maximal voltage level is lower than one hundred volts. According to another embodiment of the invention the ESD protection circuit triggering voltage maximal level is lower than sixty volts.

According to an embodiment of the invention processor 80 is adapted to compare an estimated response of an integrated circuit that includes a functional ESD protection circuit to the measured signals received during one or more testing periods.

According to an embodiment of the invention the processor 80 is adapted to find a match between a response pattern corresponding to the at least one measured signal and one out of multiple response patterns that characterize different ESD protection mechanisms.

For example, the inventors tested an integrated circuit that responded to the discharge signals from discharge capacitor in manner that is characteristic of a snap-back protection circuit. The tested integrated circuit was expected to respond in a manner that is characteristic to a non-snap back protection circuit. Accordingly, this integrated circuit was defined as non-functional.

Figure 2:
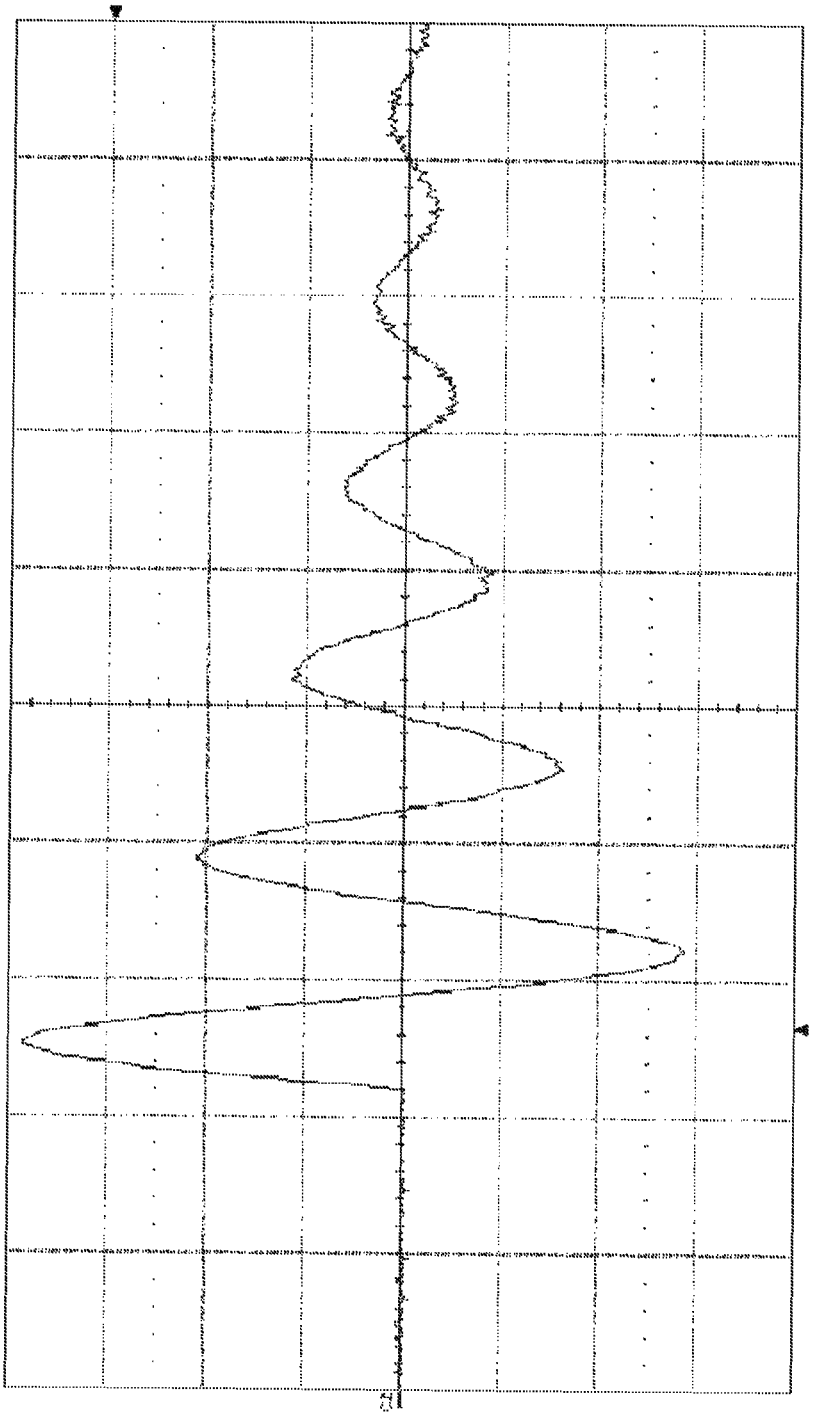
FIG. 2 is an exemplary oscilloscope snapshot of a discharge current during a short circuit test, provided by a discharge capacitor during a testing period, according to an embodiment of the invention.
Figure 3:
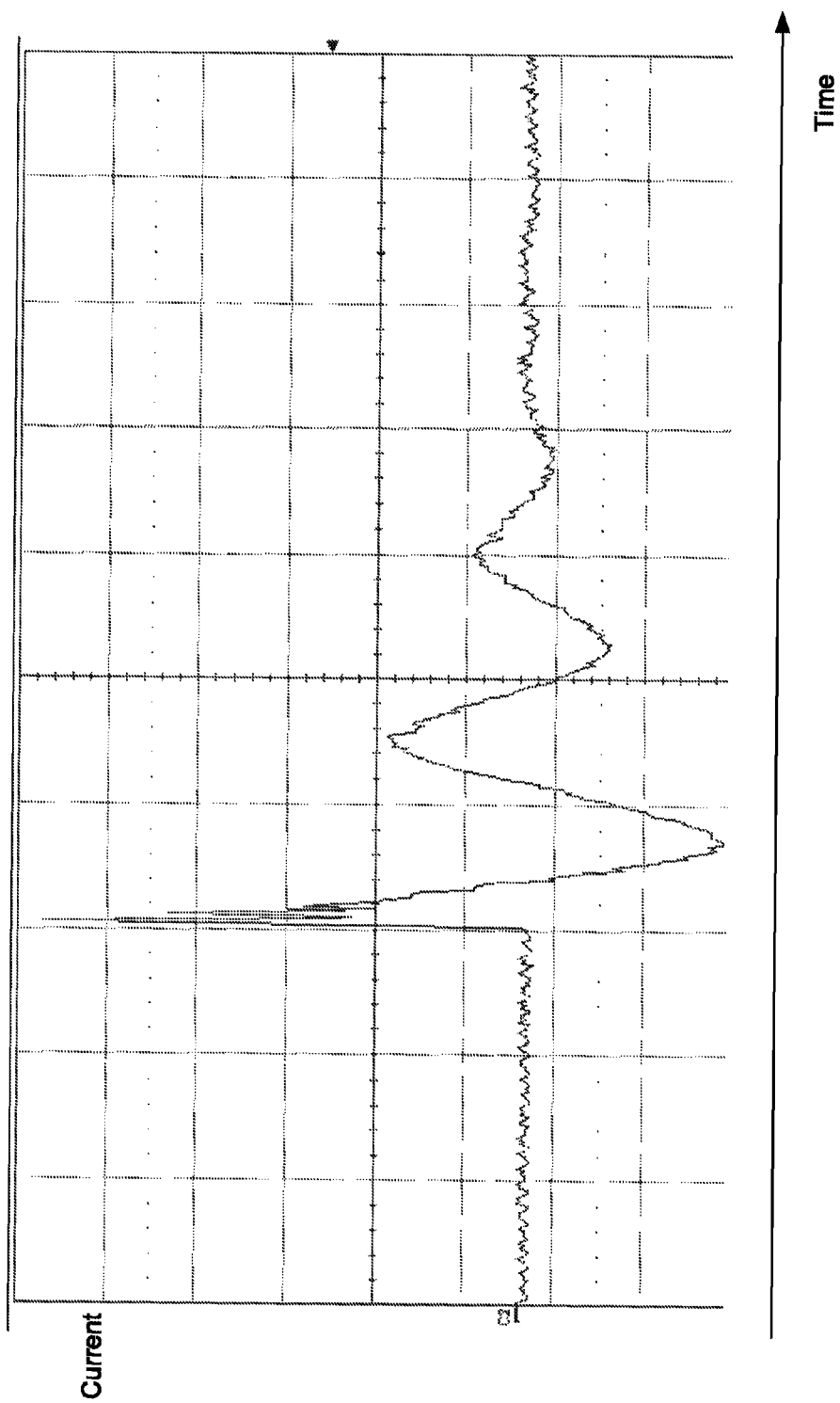
FIG. 3 is an exemplary oscilloscope snapshot of the voltage of a testing point of an integrated circuit during a testing period, according to an embodiment of the invention.

FIG. 2 is an exemplary oscilloscope snapshot of the current provided by discharge capacitor 30 during a short circuit test (during a testing period), according to an embodiment of the invention. FIG. 3 is an exemplary oscilloscope snapshot of the voltage of a testing point of integrated circuit 90 during a testing period, according to an embodiment of the invention.

The discharge capacitor 30 was charged to twenty-five volts. The peak value of the discharge current is about one Ampere. The snapshot illustrates that the discharge capacitor 30 oscillates during the testing period. The snapshot illustrated five decaying oscillations. The decay corresponds to the discharge of the discharge capacitor 30.

The ESD protection circuit of the tested integrated circuit 90 functioned properly, as it limited the voltage within the integrated circuit to an acceptable level of about two volts. The measured voltage also oscillated, and the oscilloscope snapshot illustrated four decaying oscillations.

Figure 4:
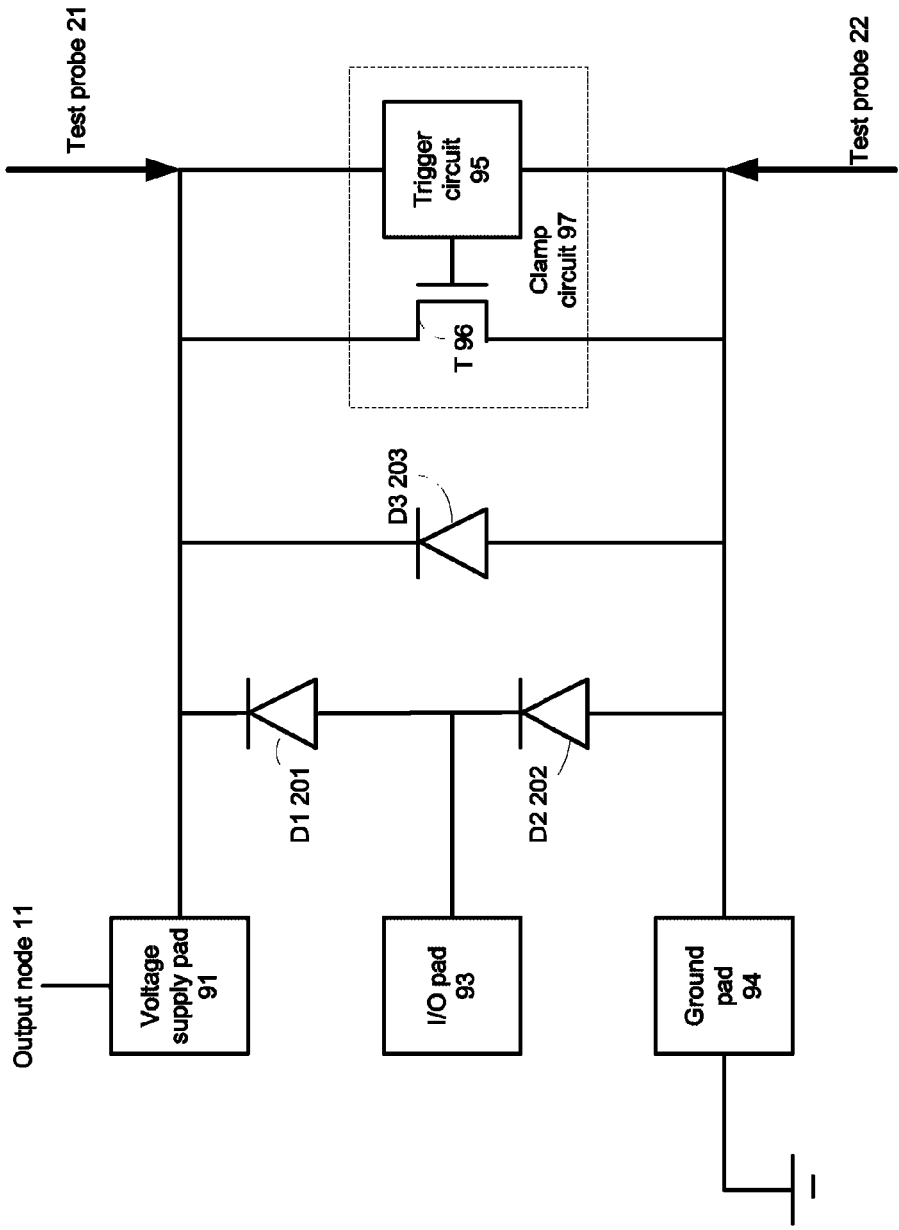
FIG. 4 illustrates an ESD protection circuit of an integrated circuit and the connections between this circuit to test probes, according to an embodiment of the invention.

FIG. 4 illustrates an ESD protection circuit 92' of integrated circuit 90 and the connections between this circuit to two test probes, according to an embodiment of the invention.

ESD protection circuit 92' can oscillate with discharge capacitor 30. It is supposed to reduce the level of voltage supplied to the integrated circuits.

ESD protection circuit 92' is connected to a voltage supply pad 91, an I/O pad 93 and a ground pad 94. The ground pad 94 is grounded. Conveniently it is connected to the same ground as discharge capacitor 30.

The voltage supply pad 91 is connected to an output node 11 of device 10. The output node 11 is connected to the discharge capacitor 30 via the discharge switch 52 and test path switch 59.

Two diodes D1 201 and D2 202 are serially connected between the voltage supply pad 91 and the ground pad. The I/O pad 93 is connected between these two diodes.

A third diode D3 203 is connected between the voltage supply pad 91 and the ground pad 94. A clamp circuit 97 is also connected between the voltage supply pad 91 and the ground pad 94. Thus, D1 and D2 are connected in parallel to D3 203 and to clamp circuit 97.

The clamp circuit 97 includes transistor T96 that is controlled by a trigger circuit 95. The gate of transistor T96 is connected to trigger circuit 95 that in turn can selectively open transistor T96. The source of transistor T96 and one input of the trigger circuit 95 are connected to the voltage supply pad 95 while the drain of transistor T96 and another input of the trigger circuit 95 are connected to the ground pad.

Testing probes 21 and 22 (collectively referred to as test probes 20 in FIG. 1) are connected to the source and drain of transistor T96 accordingly.

Figure 5:
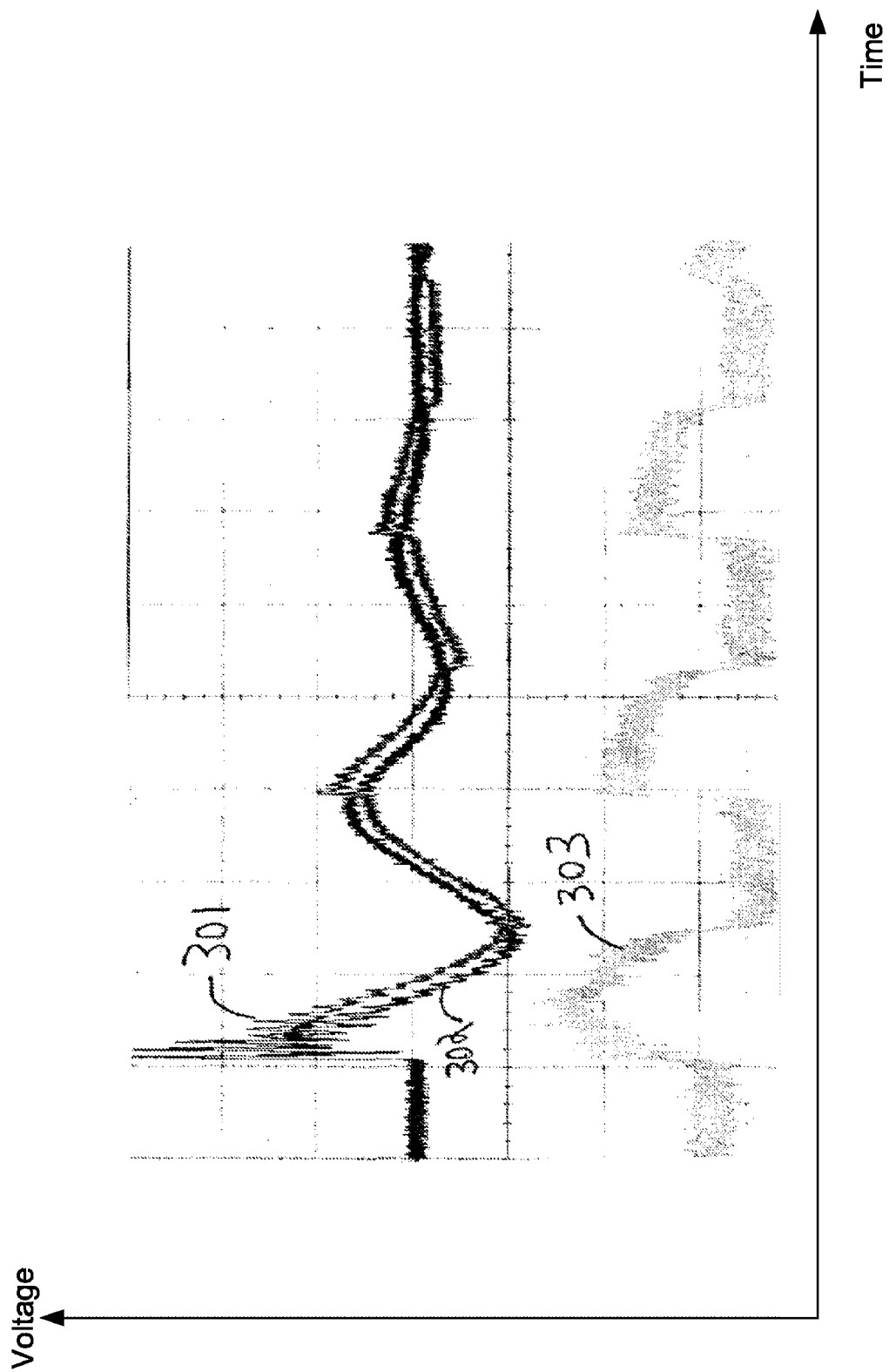
FIG. 5 illustrates exemplary oscilloscope snapshots of the voltage at the source of a transistor that belongs to the ESD protection circuit of FIG. 4, of the voltage at the drain of this transistor and the difference between these two voltages, during a testing period, according to an embodiment of the invention.

FIG. 5 illustrates exemplary oscilloscope snapshots of the voltage at the source of transistor T 36, of the voltage at a drain of transistor T 36 and the difference between these two voltages ($V_{SD}$), during a testing period, according to an embodiment of the invention.

Curve 301 illustrates the voltage at the source of transistor T96, curve 302 illustrates the voltage at the drain of transistor T96 and curve 303 illustrates the difference ($V_{SD}$) between these voltages.

Curve 301 and curve 302 are illustrated at a different scale that curve 303. They are illustrated over 5 v by 50 nSec squares while curve 303 is illustrated over 2 v by 50 nSec squares.

Curves 301-303 represent a functional integrated circuit.

Figure 6:
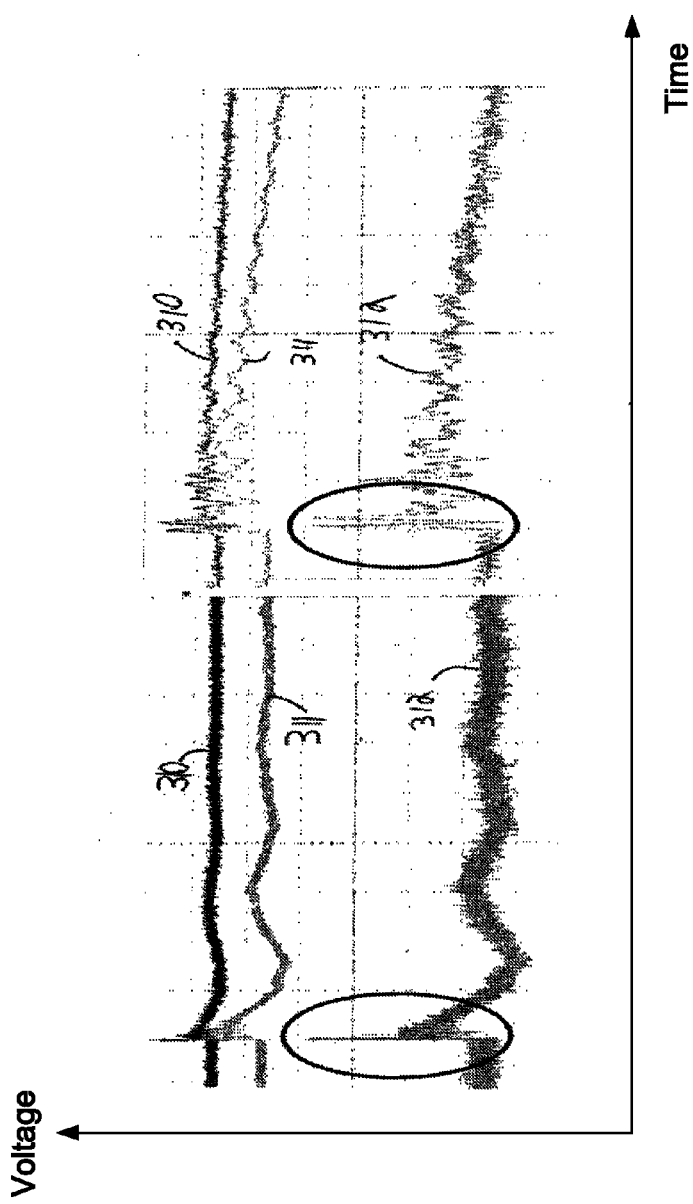
FIG. 6 illustrates another exemplary oscilloscope snapshots of the voltage at the source of a transistor that belongs to the ESD protection circuit of FIG. 4, of the voltage at the drain of this transistor and the difference between these two voltages, during a testing period, according to an embodiment of the invention.

FIG. 6 illustrates another exemplary oscilloscope snapshots of the voltage at the source of transistor T 36, of the voltage at a drain of transistor T 36 and the difference between these two voltages ($V_{SD}$), during a testing period, according to an embodiment of the invention.

Curve 310 illustrates the voltage at the source of transistor T96, curve 311 illustrates the voltage at the ground of transistor T96 and curve 312 illustrates the difference ($V_{SD}$) between these voltages.

FIG. 6 includes two snapshots that differ from each other by their scale—the right hand snapshot is a higher resolution representation of the left hand image.

Curve 312 illustrates the behavior of a defective rail based ESD protection circuit. It responded in a manner that is characteristic of a snap-back ESD protection circuit.

Figure 7:
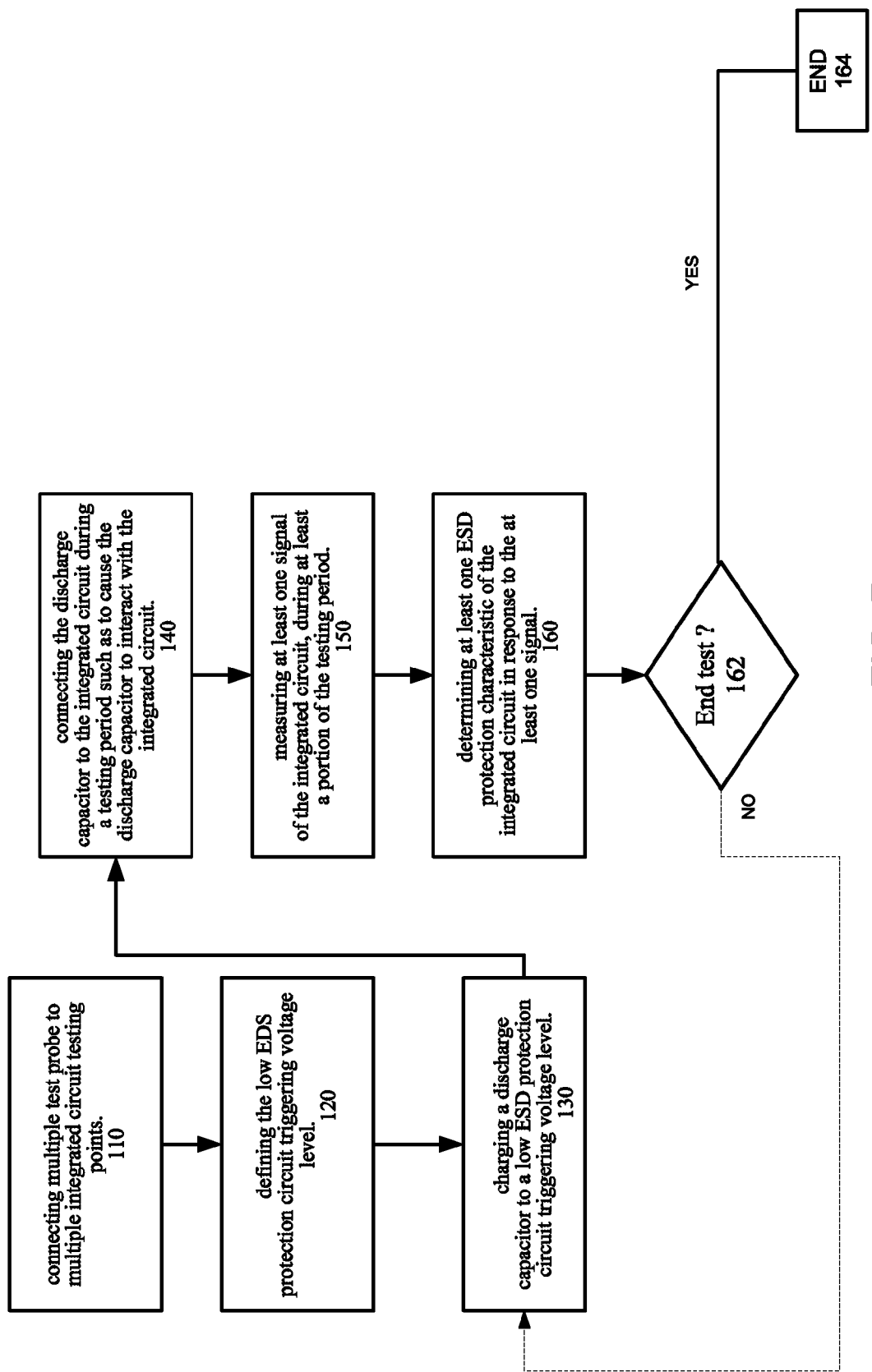
FIG. 7 is a flow chart of a method for evaluating electrostatic discharge (EDC) protection capabilities of an integrated circuit, according to an embodiment of the invention.

FIG. 7 is a flow chart of method 100 for evaluating electrostatic discharge (ESD) protection capabilities of an integrated circuit, according to an embodiment of the invention.

Method 100 starts with stage 110 of connecting one or more test probes to one or more integrated circuit testing points. These test points can be pads, but this is not necessarily so. Internal testing points can be contacted if they are accessible to the testing probes. For example, if the integrated circuit includes a protective housing then the housing can be at least partially removed in order to allow one or more test probes to contact inner testing points of the integrated circuit 90.

Stage 110 is followed by stage 120 of defining an ESD protection circuit triggering voltage level. Conveniently stage 120 includes defining an ESD protection circuit triggering maximal voltage level.

Conveniently, the definition is responsive to a discharge period of the discharge capacitor and to a predefined high repetition rate. Thus, if the repetition rate is ten tests per second then the ESD protection circuit triggering voltage level should be higher than a triggering voltage threshold of a testes ESD protection circuit but should be low enough to enable the charging and a discharging of the discharge capacitor within less than one tenth of a second.

Stage 120 is followed by stage 130 of charging a discharge capacitor to an ESD protection circuit triggering voltage level.

Stage 130 is followed by stage 140 of connecting the discharge capacitor to the integrated circuit during a testing period such as to cause the discharge capacitor to interact with the integrated circuit. The interactions may include oscillations.

Conveniently, the connecting includes selecting a test path between the discharge capacitor and the integrated circuit out of multiple test paths defined between the discharge capacitor and the integrated circuit.

Conveniently, the connecting includes coupling the discharge capacitor to the integrated circuit during a testing period that is longer than three oscillation cycles of an oscillatory circuit that comprises the discharge capacitor and at least a portion of the integrated circuit.

Conveniently, the testing period can be shorter than three oscillation cycles and even shorter than a single oscillation period.

Stage 140 is followed by stage 150 of measuring at least one signal of the integrated circuit, during at least a portion of the testing period.

Stage 150 is followed by stage 160 of determining at least one ESD protection characteristic of the integrated circuit in response to the at least one signal.

Conveniently, the determining includes comparing an estimated response of an integrated circuit that comprises a functional ESD protection circuit to the at least one signal to the estimated response.

Stage 160 can be followed by query stage 162 of determining whether to end the test. If the answer is no then query stage 162 is followed by stage 130, else it is followed by END stage 164. It is noted that rapid repetitions of stages 130-162 can be performed. It is further notes that many repetitions of stages 130-150 can precede one iteration of stage 160.

Conveniently, the determining includes finding a match between a response pattern corresponding to the at least one measured signal and one out of multiple response patterns that characterize different ESD protection mechanisms.

Those of skill in the art will appreciate that the determining can be executed in a fully automated manner. This is not necessarily so and it may involve human intervention. For example, a user can evaluate the ESD protection capabilities by analyzing the measured signals, by comparing the measured signals to one or more expected patterns and the like. Yet for another example, the evaluating and/or matching can be executed automatically.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A method for evaluating ESD protection capabilities of an integrated circuit, the method comprises:
    connecting multiple test probe to multiple integrated circuit testing points;
    charging a discharge capacitor to an ESD protection circuit triggering voltage level;
    coupling the discharge capacitor to the integrated circuit during a testing period such as to cause the discharge capacitor to interact with the integrated circuit;
    measuring at least one signal of the integrated circuit, during at least a portion of the testing period; and
    determining at least one ESD protection characteristic of the integrated circuit in response to the at least one signal.

2. The method according to claim 1 wherein the charging is preceded by defining the ESD protection circuit triggering voltage level.

3. The method according to claim 1 wherein the defining is responsive to a discharge period of the discharge capacitor and to a predefined high repetition rate.

4. The method according to claim 1 wherein the coupling comprises selecting a test path between the discharge capacitor and the integrated circuit out of multiple test paths defined between the discharge capacitor and the integrated circuit.

5. The method according to claim 1 wherein the coupling comprises coupling the discharge capacitor to the integrated circuit during a testing period that is longer than three oscillation cycles of an oscillatory circuit that comprises the discharge capacitor and at least a portion of the integrated circuit.

6. The method according to claim 1 wherein the charging comprises charging the discharge capacitor to a voltage level that is lower than 200 v.

7. The method according to claim 1 wherein the charging comprises charging the discharge capacitor to a voltage level that is lower than 100 v.

8. The method according to claim 1 wherein the charging comprises charging the discharge capacitor to a voltage level that is lower than 60 v.

9. The method according to claim 1 wherein the determining comprises comparing an estimated response of an integrated circuit that comprises a functional ESD protection circuit to the at least one signal.

10. The method according to claim 1 wherein the determining comprises finding a match between a response pattern corresponding to the at least one measured signal and one out of multiple response patterns that characterize different ESD protection mechanisms.

11. A device for evaluating ESD protection capabilities of an integrated circuit, the device comprises:
   multiple test probes adapted to be connected to multiple integrated circuit testing point; a discharge capacitor;
   a charging circuit adapted to charge the capacitor to an ESD protection circuit triggering voltage level;
   a discharging circuit, adapted to selectively couple the discharge capacitor, during a testing period, to the integrated circuit such that the discharge capacitor interacts with the integrated circuit while being discharged;
   a controller; for controlling said discharging circuit and said charging circuit; and
   a processor, coupled to the multiple test probes, wherein the processor is adapted to process multiple signals received from the multiple test probes and to assist in determining at least one ESD protection characteristic of the integrated circuit.

12. The device according to claim 11 wherein the device is adapted to define the ESD protection circuit triggering voltage level.

13. The device according to claim 11 wherein the device defines the ESD protection circuit triggering voltage level in response to a discharge period of the discharge capacitor and to a predefined high repetition rate.

14. The device according to claim 11 wherein the discharging circuit comprises multiple test paths and wherein the device selects between the multiple test paths defined between the discharge capacitor and the integrated circuit.

15. The device according to claim 11 wherein the testing period that is longer than three oscillation cycles of an oscillatory circuit that comprises the discharge capacitor and at least a portion of the integrated circuit.

16. The device according to claim 11 wherein the charging circuit is adapted to charge the discharge capacitor to a voltage level that is lower than 200 v.

17. The device according to claim 11 wherein the charging circuit is adapted to charge the discharge capacitor to a voltage level that is lower than 100 v.

18. The device according to claim 11 wherein the charging circuit is adapted to charge the discharge capacitor to a voltage level that is lower than 60 v.

19. The device according to claim 11 wherein the processor is adapted to compare an estimated response of an integrated circuit that comprises a functional ESD protection circuit to the at least one signal.

20. The device according to claim 11 wherein the processor is adapted to find a match between a response pattern corresponding to the at least one measured signal and one out of multiple response patterns that characterize different ESD protection mechanisms.

* * * * *